United States Patent [19]

Shimizu et al.

[11] Patent Number: 5,489,355
[45] Date of Patent: Feb. 6, 1996

[54] METHOD FOR PRODUCING GLITTERING DECORATIVE BOARDS

[75] Inventors: Kazuhiko Shimizu; Hajime Kubota; Satoshi Nishida, all of Tokyo, Japan

[73] Assignee: Dai Nippon Insatsu Kabushiki Kaisha, Tokyo, Japan

[21] Appl. No.: 309,542

[22] Filed: Sep. 20, 1994

Related U.S. Application Data

[63] Continuation of Ser. No. 834,572, Apr. 14, 1992.

[51] Int. Cl.$^6$ ................................................ B32B 31/00
[52] U.S. Cl. .......................... 156/230; 156/233; 156/234; 156/240
[58] Field of Search .................................. 156/230, 233, 156/234, 235, 237, 239, 240, 241, 289

[56] References Cited

U.S. PATENT DOCUMENTS

| | | | |
|---|---|---|---|
| 3,235,395 | 2/1966 | Scharf | 156/233 X |
| 3,589,962 | 6/1971 | Bonjour | 156/233 |
| 3,933,558 | 1/1976 | Takahata et al. | 156/220 X |
| 4,215,170 | 7/1980 | Vilaprinyo Oliva | 156/233 X |
| 4,810,320 | 3/1989 | Inagaki . | |
| 4,892,602 | 1/1990 | Oike et al. | 156/233 |

FOREIGN PATENT DOCUMENTS

| | | |
|---|---|---|
| 59-106966 | 6/1984 | Japan . |
| 59-148662 | 8/1984 | Japan . |
| 59-155040 | 9/1984 | Japan . |
| 60-83840 | 5/1985 | Japan . |

OTHER PUBLICATIONS

Hideki et al., "Production of Thermosetting Resin Decorative Board", Patent Abstracts of Japan, vol. 6, No. 83 (M–130) May 21, 1982.
Watabe, "Transfer Printing Method", Patent Abstracts of Japan, vol. 11, No. 149, (M–588) (2596) May 15, 1987.
Keiichi, "Transfer Foil for Copying", Patent Abstracts of Japan, vol. 13, No. 485, (M–887) Nov. 6, 1989.

Primary Examiner—James Engel
Attorney, Agent, or Firm—Foley & Lardner

[57] ABSTRACT

The present invention relates to a method for producing decorative boards excelling in brightness, the method comprising the steps of: providing a transfer sheet (1) comprising a releasable film (20), a metallized layer (5) formed on the releasable film (20) and an adhesive layer (6) formed on the metallized layer (5) over its entire surface or according to a desired pattern; transferring selectively a part of the metallized layer of the transfer sheet where the adhesive layer is formed onto a decorative board base (2) over its entire surface or a part of the decorative board base surface and/or a back side thereof by superposing the decorative board base (2) and the transfer sheet (1) of its adhesive layer side and pressing the thus obtained laminate; impregnating the thus obtained decorative board base having the metallized layer (5) with a thermosetting resin; and hot-pressing the thus impregnated decorative board base to obtain the decorative board having excellent brightness. In the present invention, since the metallized layer is formed by transferring, the decorative board excelling in brightness as well as aesthetic value can effectively be produced.

14 Claims, 2 Drawing Sheets

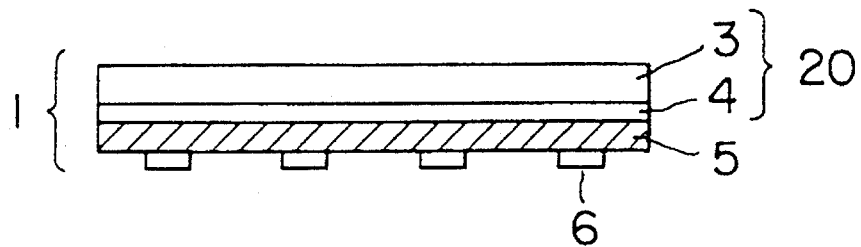
F I G. 1
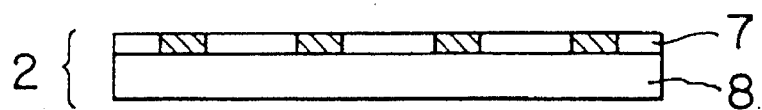
F I G. 2
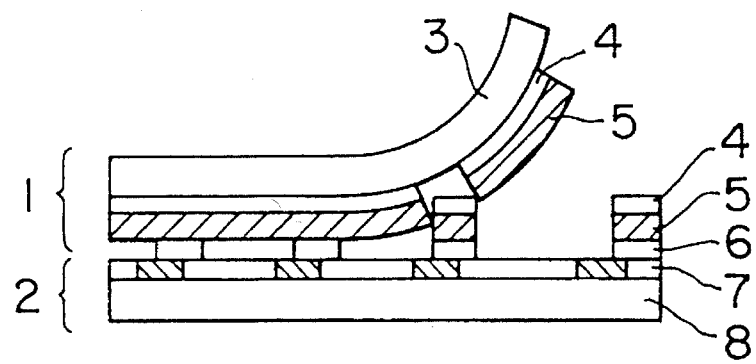
F I G. 3

METHOD FOR PRODUCING GLITTERING DECORATIVE BOARDS

This application is a continuation of United States application Ser. No. 07/834,572 filed Apr. 14, 1992.

BACKGROUND OF THE INVENTION

The present invention relates to decorative boards and, more particularly, to a method of producing thermoset decorative boards which are improved in their decorative design, especially their brightness.

In order to impart decorative designs, especially glitter or brightness to thermoset decorative boards such as melamine and DAP decorative boards, reliance has heretofore been placed upon printing glitter or luster ink comprising metallic powders, a pearlescent pigment, etc. on the surface of a decorative board base or laminating a metal foil directly on that surface. In order to improve brightness when printing is carried out with glitter ink, however, it is necessary that a large amount of a glitter pigment with an increased particle size be incorporated into the ink. A glitter pigment having a large particle size tends to precipitate out, because difficulty is encountered in dispersing it uniformly in the ink. Further, when printing is performed with ink in which the pigment is on the point of separating out, brightness variations are likely to occur. A problem with the application of a pigment having a large particle size to gravure printing is that doctor lines occur frequently due to the abrasion of a doctor blade. For this reason, the glitter ink becomes so poor in its printability that a well-printed face cannot be obtained. In addition, some limitations, imposed upon the amount to be added and the size of the glitter pigment, render it impossible to obtain any thermoset decorative sheet which excels in brightness.

The direct lamination of metal foils is best-suited for brightening the overall surface of a decorative board. However, it is unsuitable for providing a brightened presentation of a fine design or pattern because of some limitation resulting from the processability of metal foils, etc., and only produces a decorative board which is cold to the touch since its entire surface is metal-finished.

Thus, a method for producing thermoset decorative boards without recourse to either printing or direct laminating of metal foils is still in great demand.

DISCLOSURE OF THE INVENTION

In view of such demand, an object of the present invention is to provide a method for producing glittering decorative boards, hitherto unachievable by conventional printing processes.

The present invention provides a method for making glittering thermoset decorative boards, which is characterized in that a metallized layer is transferred onto a decorative board base over its entire surface or according to a desired pattern with a metallized transfer sheet, and the thus obtained decorative board base is impregnated with thermosetting resin and then hot-pressed.

The method for producing glittering decorative boards of the present invention comprises the steps of: providing a transfer sheet comprising a releasable film, a metallized layer formed on the releasable film and an adhesive layer formed on the metallized layer over its entire surface or according to a desired pattern; transferring selectively a part of the metallized layer of the transfer sheet where the adhesive layer is formed onto a decorative board base over its entire surface or a part of the decorative board base surface and/or a back side thereof by superposing the decorative board base and the transfer sheet of its adhesive layer side and pressing the thus obtained laminate; impregnating the thus obtained decorative board base having the metallized layer with a thermosetting resin; and hot-pressing the thus impregnated decorative board base to obtain the decorative board having excellent brightness.

Another mode of the present invention comprises the steps of: providing a transfer sheet comprising a releasable film and a metallized layer formed on the releasable film; transferring selectively a part of the metallized layer of the transfer sheet onto a decorative board base by superposing the decorative board base having an adhesive layer over its entire surface or a part of the decorative board base surface and/or a back side thereof and the transfer sheet and pressing the thus obtained laminate thereby to obtain the decorative board base having the metallized layer only where the adhesive layer is formed; impregnating the thus obtained decorative board base having the metallized layer with a thermosetting resin; and hot-pressing the thus impregnated decorative board base to obtain the decorative board having excellent brightness.

BRIEF DESCRIPTION OF THE DRAWINGS

FIGS. 1 to 6 are schematic views for illustrating two examples of the method according to the present invention;

FIGS. 1 to 3 illustrating the method according to Example 1, and FIGS. 4 to 6 the method according to Example 2.

BEST MODES FOR CARRYING OUT THE INVENTION

Figure 4:
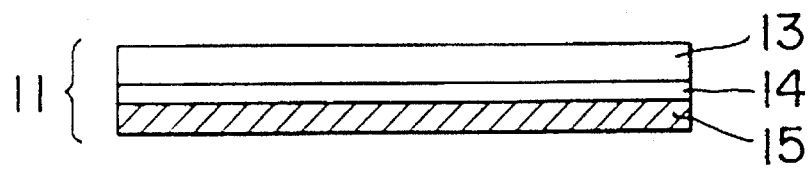

In the method for making glittering decorative boards according to the present invention, the surface of a releasable film 20 is first metallized to form a metallized layer 5 as shown in FIG. 1.

At this time, the releasable film 20 is ordinarily formed of either only a resinous film excelling in releasability or a laminate of a base film 3 with a releasing layer. Preferably, a peelable layer 4 of a transparent resin releasable from the releasable film 20 is further provided on the surface of the releasable film 20 (or on the surface of the releasing layer, if the releasable film 20 comprises the releasing layer) in order to secure complete and stable releasability between the metallized layer 5 and the releasable film 20.

Subsequently, an adhesive layer 6 is applied onto the metallized layer 5 over its entire surface or according to a pattern to prepare a transfer sheet 1. A decorative board base 2 with or without a pattern on a base substrate 8 as shown in FIG. 2 is then overlaid on the side of the adhesive layer 6 of the transfer sheet 1 to transfer onto the base substrate 8 the part of the metallized layer 5 provided with the adhesive layer 6 under the adhesive action of said adhesive layer (FIG. 3). It is to be noted that, when a patterned decorative board base is used, the adhesive layer 6 provided on the surface of the metallized layer 5 of the transfer sheet 1 is patterned in conformity with the pattern of the base so that the thus patterned metallized layer 5 can be transferred onto the base.

Next, the thus transferred decorative board base is impregnated with a thermosetting resin (not shown) by any suitable known impregnation technique.

Finally, the thus impregnated decorative board base is hot-pressed with the transferred side upward to set and form the thermosetting resin into a desired shape, whereby a thermoset decorative board with surpassing brightness can be obtained.

The metallized layer, having the thermosetting resin formed on its surface, is characterized by great resistance to abrasion and corrosion and by durability of its brightness.

It is to be understood that it is possible to form a glittering layer on the entire surface of a decorative board base by using the transfer sheet 1 in which the adhesive layer 6 is applied on the entire surface of the metallized layer 5.

Figure 5:
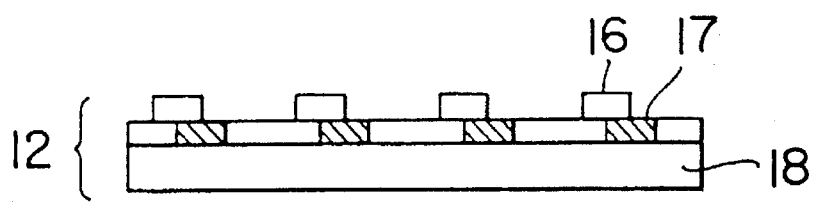
Figure 6:
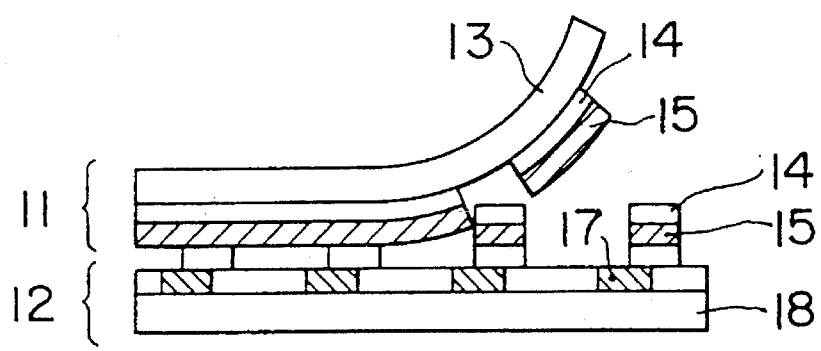

According to another mode of the above method for making glittering decorative boards, a patterned decorative board base 18 as shown in FIG. 5 is coated with an adhesive layer 16 patterned in conformity with the pattern of the base 18, and a transfer sheet 11 having a metallized layer provided on a releasable film (FIG. 4) is overlaid on the base 18 for transferring, whereby the metallized layer 15 patterned after said pattern can be provided only on the part of the base 18 coated with the adhesive layer 16.

This example is characterized in that it enables the metallized layer to be very easily transferred onto the decorative board base 18, while conforming to a primary pattern 17 provided thereon. The glitter of the thus obtained decorative board is as excellent as that of the decorative board obtained by the first-described method.

The term "in conformity with the pattern" as used herein is intended to mean that the positions of the pattern of the metallized layer and the pattern of the printed pattern layer are so adjusted to maintain a predetermined relationship. Accordingly, this term does not mean that the metal pattern overlaps completely with the printed pattern but substantially means that the two patterns are positioned in a given relationship (i.e., matched with each other).

It is possible to accurately match patterns, for example, by printing a pattern with an ink in a certain unit of a single multicolor press and then printing an adhesive layer in another unit of the same press.

When a transparent adhesive is utilized, conformity of patterns may be sometimes difficult. In such a case, however, patterns can be easily conformed with each other by adding a fluorescent brightener to the adhesive, irradiating a printed area with ultraviolet rays, and matching the patterns while detecting the fluorescence. Alternatively, a known dye or pigment may be incorporated into the adhesive for coloration and visualization.

In accordance with the present invention, it is also possible to fill the surface of the above described decorative board base by applying thereto a sealing agent. Some decorative board bases, depending on the type, have a loose texture and hence are not sufficiently strong (e.g., titanium paper). A base of such poor strength, if subjected to transfer printing, would peel in the surface or intermediate layer and may sometimes be peeled off toward the side of a transfer sheet. Thus, it is desirable in the present invention that a sealing agent be applied or coated onto the surface of the base thereby to prevent such delamination in the base and also to prevent reduction in adhesive strength of the adhesive due to the permeation thereof into the base.

For the sealing agent, a resin with an affinity for a resin to be used in the subsequent impregnation (e.g., melamine resin) is preferred. Example of such resins include cellulose resin and acrylic resin.

The materials suitable for use in the method of making glittering decorative boards according to the present invention will now be described in greater detail.

As the transfer sheets 1 and 11, use is preferably made of substrates 3, 13 formed of films of synthetic resins such as polyesters such as polyethylene terephthalate and polyethylene terephthalate/isophthalate copolymers, polyolefins such as polyethylene, polypropylene and polymethylpentene, polyvinyl chloride, polyamide, fluorine resins such as polyvinyl fluoride and polyvinylidene fluoride; cellophane; paper; gold foils; and the like, said substrates being coated with releasing resins such as acrylic, melamine and silicone resins and provided with metallized layers 5, 15 in that order. Although not specifically critical, the films may have a thickness of 12 to 50 μm, most preferably about 25 μm in consideration of handling. For forming the metallized layers, use may be made of metals capable of being vapor-deposited such as chromium, copper, brass, aluminium, gold and silver, which may be selected depending upon the desired metallic luster.

Preferably, the adhesive layers 6, 16 to be applied on the metallized side of the transfer sheet or the surface of the decorative board base are heat-sensitive adhesives comprising butyral, vinyl chloride, ethylene-vinyl acetate, vinyl chloride/vinyl acetate copolymer, acrylic, polyamide and like resins. The heat-sensitive adhesives may be provided by known printing methods such as gravure, silk screening, offset and type printing.

Although not critical in kind, the decorative board bases 8 and 18 may be titanium paper of ordinarily 50 to 150 g/m$^2$ containing a titanium oxide pigment. If required, this paper may be provided with a printed pattern layer on its transfer side.

The thermosetting, impregnating resins used may be melamine, diallyl phthalate, guanamine, polyester, phenolic and other resins. In consideration of effects upon decorative designs, particular preference is given to melamine and diallyl phthalate resins. Such thermosetting resins may be incorporated into decorative board bases by impregnating techniques making use of ordinary impregnating machines.

EXAMPLE 1

With an ink containing cellulose acetate as a vehicle, a grained pattern 7 is formed on a white decorative board base 8 of 80 g/m$^2$ by gravure printing.

Cellulose acetate resin 4 is print-coated on the surface of a polyester film 3 having a thickness of 25 μm to prepare a releasing sheet. An aluminized layer 5 is then vapor-deposited onto the releasing sheet to a thickness of 400Å in a conventional manner. Further, an olefin emulsion based heat-sensitive adhesive resin 6 is gravure-printed on that sheet after the stone grain pattern 7 to prepare a transfer sheet 1.

Then, the transfer sheet 1 is overlaid on the grained, decorative board base 2, which step is followed by hot-pressing at 120° C. and a pressure of 2 kg/cm$^2$ for 2 seconds. Thereafter, the transfer sheet is peeled off the decorative board base to transfer the aluminized layer onto that base, thereby obtaining a grain-printed paper sheet to which striking brightness is imparted.

Next, the thus obtained grain-printed paper sheet is impregnated with a thermosetting resin liquid comprising 50 parts by weight of melamine-formaldehyde resin, 45 parts by weight of water and 5 parts of isopropyl alcohol in an amount of 90 g/m$^2$ (on dry basis) with an ordinary impregnating machine and then dried.

Finally, the above impregnated sheet together with an overlay sheet of 35 g/m$^2$ thereon, both impregnated with a thermosetting resin under the same conditions as those for the grain-printed paper sheet, is laminated on four core sheets. The laminate is interleaved between two mirror-finished metallic sheets, and the assembly is heated at 135° C. and 100 kg/cm² for 20 minutes to obtain a melamine decorative board of striking brightness.

EXAMPLE 2

With an ink containing cellulose acetate as a vehicle, a stone grain pattern 17 is formed on a white decorative board base of 80 g/m² by gravure printing. Then, with a gravure printing plate patterned after the above grained pattern, an olefinic emulsion type of heat-sensitive ink 16 is printed on the above grain-printed decorative board base to obtain a grain-printed paper sheet 12.

A polyamide resin 14 is print-coated on the surface of a polyester film 13 having a thickness of 25 μm to prepare a releasing sheet. An aluminized layer is then vapor-deposited onto the releasing sheet to a thickness of 400Å in a conventional manner, thereby preparing a transfer sheet 11.

Then, the transfer sheet 11 is overlaid on the grain-patterned, decorative board base 12 and hot-pressed at 120° C. and a pressure of 2 kg/cm² for 2 seconds. Thereafter, the transfer sheet is peeled off the decorative board base to transfer the aluminized layer onto that base, thereby obtaining a grain-printed paper sheet of striking brightness.

Finally, the obtained grain-printed board having the aluminized layer is impregnated and hot-pressed similarly as in Example 1 to obtain a melamine decorative board of striking brightness.

According to the present invention, a metallized layer of greatly striking brightness is formed on a decorative board base by transfer techniques, thus making it possible to produce a decorative board of greatly improved brightness, hitherto unachievable with glitter ink comprising metallic powders, etc. In addition, the present invention can successfully prevent the occurrence of doctor lines or brightness variations likely to occur with the use of glitter ink. Over decorative boards obtained by the direct lamination of metallic foils, the decorative boards produced by the method of the present invention have various advantages due to the presence of a resinous layer on their surfaces. For instance, the present boards excel in their surface properties, and permit a pattern of partially increased brightness to be provided thereon, conforming to a primary pattern, so making it possible to form a greatly glittery, decorative pattern.

INDUSTRIAL APPLICABILITY

The present invention can widely be utilized for production of decorative board as surface materials for furniture, a kitchen product or a wall etc.

We claim:

1. A method for producing a decorative board having excellent brightness, comprising the steps of:

providing a transfer sheet comprising a releasable film, a metallized layer formed on the releasable film, and an adhesive layer comprising a heat sensitive adhesive comprising an olefin emulsion-based heat-sensitive adhesive resin formed on the metallized layer, wherein the metallized layer is not absorbed into the adhesive layer;

transferring selectively at least a part of the metallized layer of the transfer sheet where the adhesive layer is formed onto at least a portion of a decorative board base by superimposing the decorative board base on the adhesive layer and hot-pressing so as to transfer the metallized layer onto the decorative board base only where the adhesive layer is formed;

impregnating the decorative board base having at least a part of the metallized layer transferred thereto with a thermosetting resin; and hot-pressing the impregnated decorative board base so as to obtain the decorative board having excellent brightness.

2. The method as claimed in claim 1, wherein a pattern layer is formed on the surface of the decorative board base.

3. The method as claimed in claim 1, wherein a sealing agent is applied onto the surface of the decorative board base.

4. The method as claimed in claim 2, wherein a sealing agent is applied onto the surface of the decorative board base and then the pattern layer is formed on its surface.

5. The method as claimed in claim 2, wherein transferring is conducted so as to conform the pattern layer of the decorative board base with the metallized layer to be transferred.

6. The method as claimed in claim 1, wherein the adhesive layer comprises a heat sensitive adhesive and the adhesive layer is hardened by the hot-pressing step.

7. The method as claimed in claim 1, wherein drying is conducted after the impregnation with the thermosetting resin.

8. A method for producing a decorative board having excellent brightness, comprising the steps of:

providing a transfer sheet comprising a releasable film and a metallized layer formed on the releasable film;

providing a decorative board base having an adhesive layer comprising a heat sensitive adhesive comprising an olefin emulsion-based heat-sensitive adhesive resin formed on the decorative board base, transferring selectively at least a part of the metallized layer of the transfer sheet onto a decorative board base, the decorative board base having an adhesive layer comprising a heat sensitive adhesive formed on the decorative board base, by superposing the adhesive layer over the metallized layer of the transfer sheet, wherein the metallized layer is not absorbed into the adhesive layer and hot-pressing so as to transfer the metallized layer only where the adhesive layer is formed;

impregnating the decorative board base having at least a part of the metallized layer transferred thereto with a thermosetting resin; and hot-pressing the thus impregnated decorative board base so as to obtain the decorative board having excellent brightness.

9. The method as claimed in claim 8, wherein a sealing agent is applied onto the surface of the decorative board base.

10. The method as claimed in claim 8, wherein a sealing agent is applied onto the surface of the decorative board base and then the pattern layer is formed on its surface.

11. The method as claimed in claim 9, wherein transferring is conducted so as to conform the pattern layer of the decorative board base with the adhesive layer.

12. The method as claimed in claim 8, wherein the adhesive layer comprises a heat sensitive adhesive and the adhesive layer is hardened by the hot-pressing step.

13. The method as claimed in claim 8, wherein drying is conducted after the impregnation with the thermosetting resin.

14. The method as claimed in any one of claims 1–8 and 9–13, wherein a peeling layer is formed between the releasable film and the metallized layer.

* * * * *